United States Patent
Van Der Net et al.

(10) Patent No.: US 7,227,612 B2
(45) Date of Patent: Jun. 5, 2007

(54) LITHOGRAPHIC APPARATUS AND DEVICE MANUFACTURING METHOD

(75) Inventors: Antonius Johannes Van Der Net, Tilburg (NL); Tjarko Adriaan Rudolf Van Empel, Eindhoven (NL); Ronald Van Der Ham, Maarheeze (NL)

(73) Assignee: ASML Netherlands B.V., Veldhoven (NL)

( * ) Notice: Subject to any disclaimer, the term of this patent is extended or adjusted under 35 U.S.C. 154(b) by 264 days.

(21) Appl. No.: 10/937,871

(22) Filed: Sep. 10, 2004

(65) Prior Publication Data

US 2006/0055899 A1    Mar. 16, 2006

(51) Int. Cl.
*G03B 27/52* (2006.01)
*G03B 27/42* (2006.01)

(52) U.S. Cl. .............................. 355/30; 355/53; 355/62

(58) Field of Classification Search .................. 355/30, 355/53, 67, 72, 75, 62
See application file for complete search history.

(56) References Cited

U.S. PATENT DOCUMENTS 5,892,572 A    4/1999    Nishi 6,542,220 B1    4/2003    Schrijver et al.
6,747,729 B2    6/2004    Pril et al.

FOREIGN PATENT DOCUMENTS

EP    0 498 499 B1    8/1997

*Primary Examiner*—Peter B. Kim
(74) *Attorney, Agent, or Firm*—Pillsbury Winthrop Shaw Pittman LLP

(57) ABSTRACT

A lithographic apparatus includes a support constructed to support a patterning device that is capable of imparting a radiation beam with a pattern in its cross-section to form a patterned radiation beam, a substrate table constructed to hold a substrate, a projection system configured to project the patterned radiation beam onto a target portion of the substrate, an interior space through which an interferometer beam propagates, and a first gas supply for supplying a purge gas to inhibit contamination of the projection system. The purge gas has a predetermined refractive index. The apparatus also includes a second gas supply for supplying a conditioning gas to the interior space for conditioning the interior space, and a refractive index matching system arranged to match the refractive index of the conditioning gas to the predetermined refractive index of the purge gas.

74 Claims, 2 Drawing Sheets

LITHOGRAPHIC APPARATUS AND DEVICE MANUFACTURING METHOD

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

United States patent U.S. Pat. No. 6,542,220 B1 describes a lithographic apparatus, having at least one compartment closely surrounding at least one of the mask and substrate holders. During use, a purge gas is supplied to the compartment for flushing the compartment. The purge gas is transparent to the radiation of the projection beam. An air shower is provided above an area traversed by interferometer measurement beams, for interferometer conditioning.

United States patent U.S. Pat. No. 6,747,729 B2 describes a lithographic projection apparatus in which a purge gas is supplied to a space to displace ambient air from that space. Particularly, the mask and substrate stages are flushed with a specific gaseous composition having a refractive index identical to that of air under the same measuring conditions, so that interferometric displacement measuring devices are able to operate to a required degree of accuracy. For example, according to U.S. Pat. No. 6,747,729, the purge gas includes two or more components selected from $N_2$, He, Ar, Kr, Ne and Xe.

European Patent EP 0 498 499 B1 discloses, among other things, the application of a constant, preferably laminar stream of air through the space in which interferometer beams propagate. To this aim, an air shower is applied. Both the purity and the temperature of the supplied air can be controlled. The stream of air provides an improved accuracy of a composite interferometer system of the lithographic apparatus.

Each of the above-mentioned patents U.S. Pat. No. 6,542,220 B1, U.S. Pat. No. 6,747,729 B2 and EP 0 498 499 B1 is incorporated in the present application in its entirety by reference.

Purge hoods and microenvironments may be used to prevent contamination of optics of the lithographic apparatus. For example, a certain optical performance is maintained using extremely clean dry air, for example, purified compressed air. Such air has a water vapor content of about 0%, or at least <1 ppb. This is advantageous, because water might serve as a catalyst for reactions on the optics when being irradiated with the projection beam, and such reactions deteriorate the functioning of the optics.

A problem with the use of purified dry air is that such dry air may hamper the operation of interferometer positioning devices of the apparatus. These positioning devices utilize interferometer beams which traverse spaces filled with common, usually water vapor containing, clean environmental air, see, for example, EP 0 498 499 B1. This wet clean air is usually circulated in large amounts from an environment of the apparatus, such as the commonly known 'clean room,' through respective areas of the apparatus and back to the clean room environment thereof. In that case, the circulated air has the same humidity as the air of the environment of the apparatus. Particularly, the dry purging air may leak from a respective microenvironment into the space through which interferometer beams traverse, locally leading to variations of the refractive index, which reduce the accuracy of the relevant interferometer measurements.

SUMMARY

It is desirable to improve the lithographic apparatus and a method for manufacturing a device, particularly for the manufacture of improved and/or less expensive devices.

It is an aspect of the present invention to reduce contamination of certain apparatus parts, such that a desired operation of interferometer positioning devices may be guaranteed and/or improved.

It is an aspect of the present invention to provide a lithographic apparatus and a lithographic manufacturing method, in which devices may be made with high accuracy, using relatively inexpensive devices for preventing contamination of optics and/or using relatively inexpensive devices for conditioning interferometer beam areas of the apparatus.

According to an aspect of the invention, there is provided a lithographic apparatus that includes a support constructed to support a patterning device that is capable of imparting a radiation beam with a pattern in its cross-section to form a patterned radiation beam, a substrate table constructed to hold a substrate, a projection system configured to project the patterned radiation beam onto a target portion of the substrate, at least one interior space through which at least one interferometer beam propagates during use, at least one first gas supply for supplying at least one purge gas to at least part of the projection system for inhibiting contamination thereof. The at least one purge gas has a predetermined refractive index. The apparatus also includes at least one second gas supply for supplying at least one conditioning gas to the interior space for conditioning the interior space, and a refractive index matching system arranged to match the refractive index of the conditioning gas to the predetermined refractive index of the purge gas.

Therefore, contamination of certain apparatus parts may be reduced, so that a desired operation of interferometer positioning devices may be guaranteed and/or so that such operation is improved for meeting desired overlay requirements.

In an embodiment of the invention, the conditioning gas is clean conditioning air, for example, wet air, and the refractive index matching system is arranged to mix the clean air with at least one refractive index matching gas for matching the refractive index of the conditioning air to the refractive index of the purge gas.

According to an embodiment of the invention, the refractive index matching system includes a clean air supply, as well as at least one refractive index matching gas supply.

According to an embodiment, the purge gas is dry air having a relative humidity rH of about 0%.

According to an aspect of the invention, a lithographic projection apparatus is arranged to project a pattern from a patterning device onto a substrate. The apparatus includes at least one interferometer positioning device using at least one interferometer beam. The beam propagates through an interior space during use. The interior space is filled at least with clean air for conditioning said interior space. The apparatus also includes at least one microenvironment filled with at least one purge gas, and a refractive index matching system arranged to mix said clean air with at least one refractive index matching gas for matching the refractive index of the clean air to the refractive index of the purge gas.

According to an aspect of the invention, a lithographic projection apparatus is arranged to project a pattern from a patterning device onto a substrate. The apparatus includes at least one air intake for receiving air from an outer environment of the apparatus, at least one air supply for supplying the air to an interior space of the apparatus, and at least one refractive index matching gas supply for supplying at least one refractive index matching gas to the air received from the outer environment of the apparatus.

According to an aspect of the invention, there is provided a lithographic apparatus that includes a substrate table constructed to hold a substrate, a projection system configured to project a patterned radiation beam onto a target portion of the substrate, and at least one first gas supply for supplying at least one dry purge gas to a microenvironment. The microenvironment extends between said projection system and said substrate and/or said substrate table. The apparatus also includes an interior space through which at least one position sensor beam propagates during use, at least one second gas supply for supplying air to said interior space, and a refractive index matching system arranged to the match the refractive index of said air to the refractive index of said purge gas by utilizing at least one refractive index matching gas.

According to an aspect of the invention, there is provided a lithographic apparatus that includes a support constructed to support a patterning device. The patterning device is capable of imparting a radiation beam with a pattern in its cross-section to form a patterned radiation beam. The apparatus also includes a substrate table constructed to hold a substrate, a projection system configured to project the patterned radiation beam onto a target portion of the substrate, and at least one first gas supply for supplying at least one dry purge gas to a microenvironment. The microenvironment extends between the projection system and the patterning device. The apparatus also includes an interior space through which at least one position sensor beam propagates during use, at least one second gas supply for supplying air to said interior space, and a refractive index matching system arranged to match the refractive index of said air to the refractive index of said purge gas, utilizing at least one refractive index matching gas.

According to an aspect of the invention, there is provided a device manufacturing method that includes projecting a patterned beam of radiation onto a substrate. The method utilizes an apparatus according to the invention.

According to an aspect of the invention, there is provided a device manufacturing method that utilizes a lithographic apparatus. The method includes projecting a patterned beam of radiation onto a substrate with a projection system, measuring at least one distance and/or displacement with at least one interferometer beam. The interferometer beam propagates through at least one interior space of the lithographic apparatus. The method also includes supplying at least one purge gas to at least part of the projection system for preventing contamination thereof, supplying a conditioning gas mixture to said interior space for conditioning said interior space, and matching the refractive index of said conditioning gas mixture to a predetermined refractive index of said purge gas.

According to an aspect of the invention, there is provided a device manufacturing method that utilizes a lithographic apparatus. The method includes using at least one interferometer beam. The beam propagates through an interior space of the apparatus. The interior space is filled at least with clean air for conditioning that space. The method also includes filling at least one microenvironment with at least one purge gas, and mixing the clean air with at least one refractive index matching gas for matching the refractive index of the air to the refractive of the purge gas.

According to an aspect of the invention, there is provided a device manufacturing method that utilizes a lithographic apparatus. The method includes patterning a beam of radiation with a patterning device, projecting the patterned beam of radiation onto a substrate with a projection system, and measuring at least one distance and/or displacement with at least one interferometer beam. The interferometer beam propagates through at least one interior space of the lithographic apparatus. The method also includes conditioning the interior space with clean conditioning air, filling at least one microenvironment within the lithographic apparatus with at least one purge gas, and mixing said clean conditioning air with at least one refractive index matching gas for matching the refractive index of the air to the refractive index of said purge gas.

According to an aspect of the invention, there is provided a device manufacturing method that utilizes a lithographic apparatus. The method includes patterning a beam of radiation with a patterning device, projecting the patterned beam of radiation onto a substrate with a projection system, pumping air into at least one interior space of the apparatus, and supplying at least one refractive index matching gas to the air received from the outer environment of the apparatus.

For example, the purge gas may be dry air, which is relatively inexpensive and safe to use. The clean air for conditioning the interior space may have a humidity of about 10% or more, or another humidity.

According to an aspect of the invention, there is provided a device manufacturing method that utilizes a lithographic apparatus. The method includes: pumping air into at least one interior space of the apparatus; and supplying at least one refractive index matching gas to the air received from the outer environment of the apparatus.

The humidity of the air may be measured before, during and/or after the air is received by the air intake. Also, the refractive index matching gas may be supplied in a certain amount to the air. The amount may be dependent on the measured humidity of the air.

Furthermore, the refractive index matching gas may have a refractive index which is higher than the refractive index of clean dry air, depending on a desired refractive index to be achieved. Furthermore, as an example, the refractive index matching gas preferably is nitrogen.

According to an aspect of the invention, there is provided a computer readable storage medium storing a program which when run on a computer controls the computer to perform a method that includes projecting a patterned beam of radiation onto a substrate with a projection system, and measuring at least one distance and/or displacement with at least one interferometer beam. The interferometer beam propagates through at least one interior space of the lithographic apparatus. The method also includes supplying at least one purge gas to at least part of the projection system for preventing contamination thereof, supplying a conditioning gas mixture to said interior space for conditioning said interior space, and matching the refractive index of said conditioning gas mixture to a predetermined refractive index of said purge gas.

According to an aspect of the invention, there is provided a device manufactured using any of the apparatus and/or device manufacturing methods disclosed herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
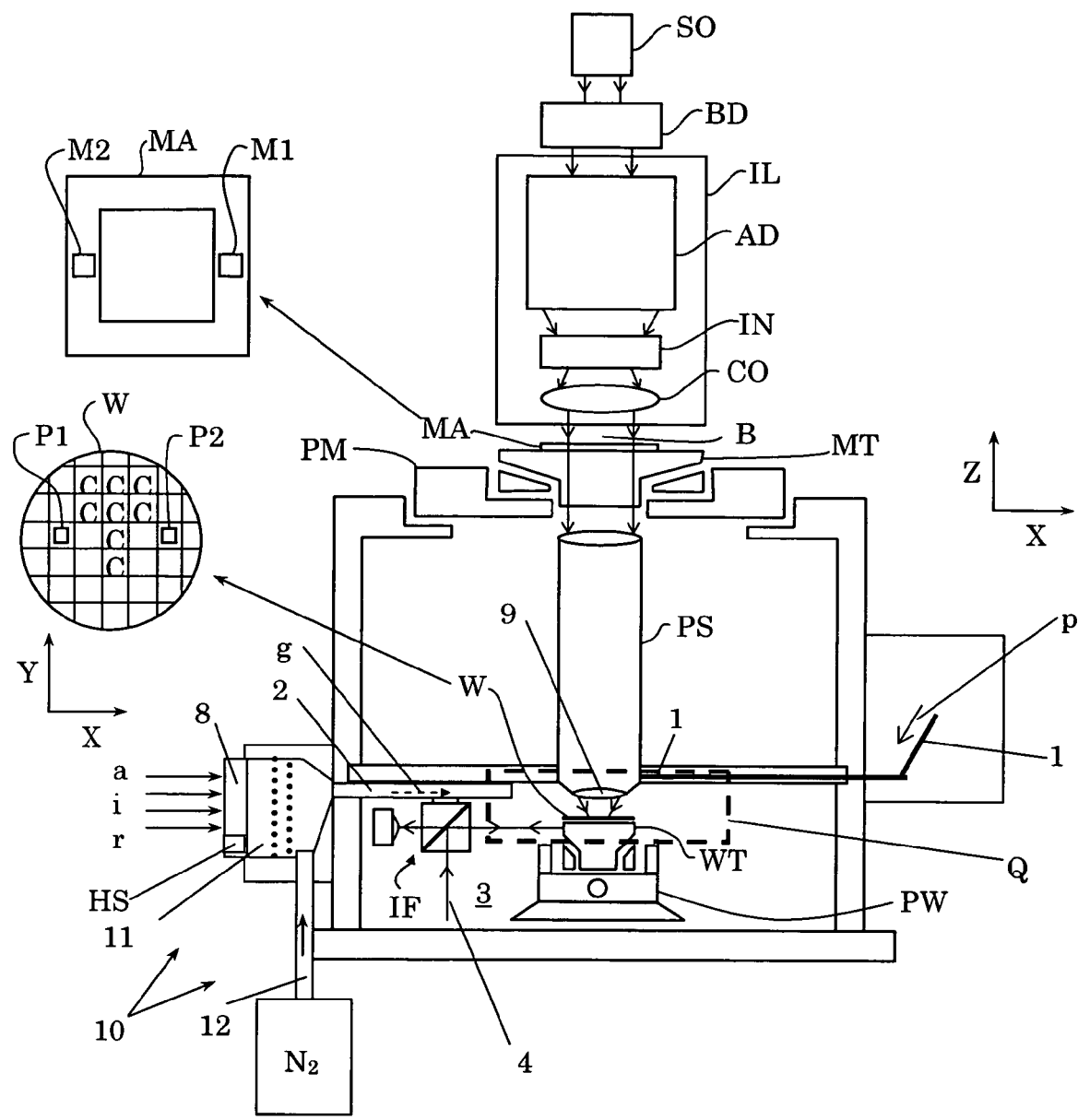
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by the patterning device MA onto a target portion C (e.g. including one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT supports, i.e. bears the weight of, the patterning device MA. It holds the patterning device MA in a manner that depends on the orientation of the patterning device MA, the design of the lithographic apparatus, and other conditions, such as, for example, whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as needed. The support structure MT may ensure that the patterning device MA is at a desired position, for example, with respect to the projection system PS. Any use of the terms "reticle" or "mask" herein may be considered synonymous with the more general term "patterning device."

The term "patterning device" as used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" as used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases, the source may be an integral part of the lithographic apparatus, for example, when the source is a mercury lamp. The source SO and the illuminator IL, together with the beam delivery system BD, if needed, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may include various other components, such as an integrator IN and a condenser CO. The illuminator IL may be used to condition the radiation beam to have a desired uniformity and intensity distribution in its cross-section.

The radiation beam B is incident on the patterning device MA (e.g., a mask), which is held on the support structure MT (e.g., a mask table), and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner), the support structure MT may be connected to a short-stroke actuator only, or may be fixed. The patterning device MA and substrate W may be aligned using mask alignment marks M1, M2 and substrate alignment marks P1, P2, respectively. Although the substrate alignment marks P1, P2 as illustrated occupy dedicated target portions, they may be located in spaces between target portions (these are known as scribe-lane alignment marks). Similarly, in situations in which more than one die is provided on the patterning device MA, the mask alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
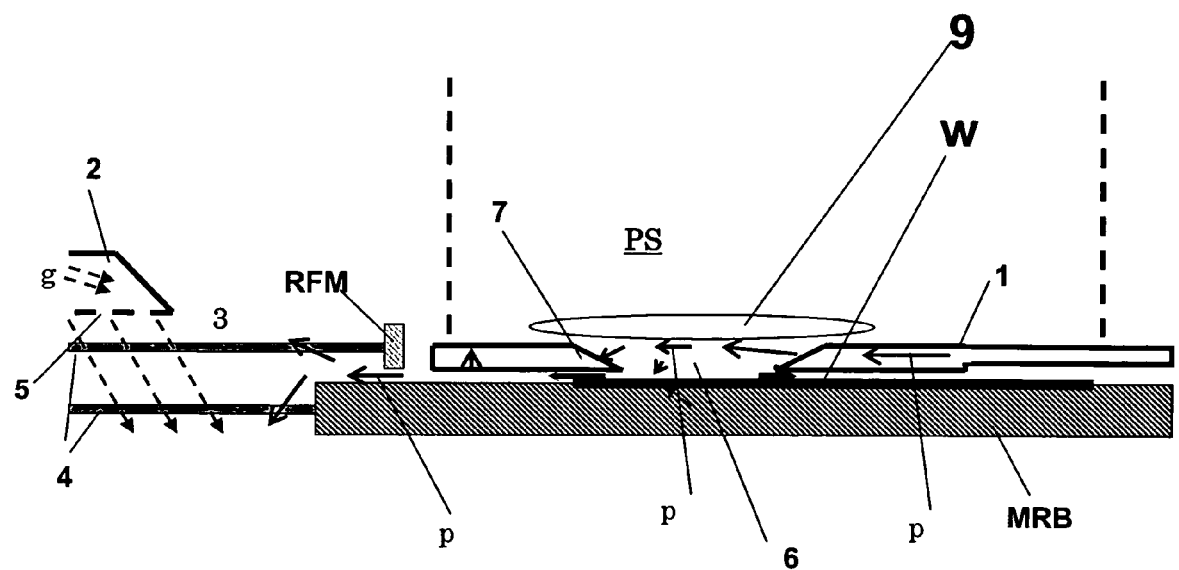
FIG. 2 schematically depicts a detail Q of FIG. 1.

FIG. 2 shows part of the apparatus of FIG. 1. As is shown in FIGS. 1 and 2, the apparatus further includes an interior space 3 through which interferometer beams 4 propagate during use. Particularly, one or more interferometers IF are provided, which use the interferometer beams 4 for measuring distances and/or distance variations between apparatus parts. As is shown in FIG. 2, such beams 4 may be directed to and reflected by a mirror block MRB which is part of the substrate support structure, and/or a reference mirror RFM located near the mirror block and the like. Such interferometer beams 4 may also traverse the interior space of the apparatus near the patterning device MA. The interferometers IF, and their beams 4, may be used, for example, in the precise aligning of the patterning device MA and the substrate W.

The apparatus includes a first gas supply 1 for supplying a purge gas to at least part of the projection system PS for preventing contamination thereof. The purge gas has a predetermined refractive index $n_1$. This predetermined refractive index $n_1$ may vary, for example, in relation to certain pressure and/or temperature changes. The apparatus may include, for example, a device for measuring, determining and/or calculating the refractive index $n_1$ of the purge gas. Preferably, the purge gas may be or include dry air, which has a relative humidity of about 0%. Dry air is relatively cheap and safe to use. The apparatus may include, for example, a dry air generator, not shown, for generating the dry air. During use, the flow of dry air is relatively low, for example, in the range of about 20–100 l/min.

In the present embodiment, the first gas supply 1 includes a purge hood 7, which creates a microenvironment 6 near a final lens 9 of the projection system PS to prevent contamination of that lens 9. A purge gas flow has been depicted with arrows p. The lens 9 extends at least opposite (and in sight of) the substrate W and/or the substrate table WT.

The apparatus further includes a second gas supply 2 for supplying a conditioning gas mixture to the interior space 3 for conditioning that space 3. A flow of the conditioning gas mixture is shown by arrows g. In the present embodiment, the second gas supply system 2 includes an air shower 5 for feeding the conditioning gas mixture into the interior space 3. Both the purity and the temperature of the conditioning gas mixture can be controlled, for example by one or more filters, temperature controllers, and the like.

In the present embodiment, the conditioning gas mixture simply contains clean air, for example, wet air, and at least one refractive index matching gas for matching the refractive index of that clean air to the refractive index $n_1$ of the purge gas. In case the purge gas is dry air, the purge gas has a higher refractive index $n_1$ of than the refractive index the wet air of the conditioning gas mixture. Therefore, advantageously, a refractive index matching gas is used which has a refractive index that is higher than the refractive index of dry air. Such a matching gas may be nitrogen.

The air of the conditioning gas mixture may have, for example, a relative humidity rH of about 1% or more during use, or about 10% or more during use, for example, a relative humidity rH in the range of about 20–80%. During use, a relatively large conditioning gas flow is applied for conditioning the interior space 3. This gas flow is, for example, in the range of circa 500–1000 m$^3$/hour. The flow of clean conditioning air is typically much higher than the flow of the purge gas.

The apparatus includes a refractive index matching system 10 which is arranged to the match the refractive index $n_2$ of the conditioning gas mixture to the predetermined refractive index $n_1$ of the purge gas. The refractive index matching system 10 includes a clean air supply 11, as well as at least one refractive index matching gas supply 12. The clean air supply 11 includes an air intake 8 for receiving air from an outer environment of the apparatus. The refractive index matching system 10 is preferably arranged to supply at least one refractive index matching gas in such amount to the clean air so that the refractive index $n_2$ of the resulting gas mixture is the same as the refractive index of the purge gas $n_1$. To this aim, the matching system 10 may include suitable flow controllers, one or more gas sources, pumps and the like, as will be clear to the skilled person. The refractive index of the usually wet conditioning gas can easily be matched to the refractive index $n_1$ of the dry air purge gas. Preferably, the refractive index matching system 10 is arranged to add at least one refractive index matching gas, for example a suitable flow of nitrogen, to the flow the clean conditioning air for increasing the refractive index thereof.

As follows from the above, in one embodiment of the invention, the conditioning gas mixture includes clean air and at least one refractive index matching gas. Preferably, the refractive index matching gas is nitrogen. The use of nitrogen is advantageous, because it is a relatively harmless and inexpensive gas. Also, nitrogen has a refractive index which is higher than the refractive index of clean dry air. Therefore, nitrogen may be mixed with the wet air for matching the refractive index of the wet air to that of the dry air purging gas.

In an embodiment of the invention, the refractive index matching system is arranged to measure the humidity of the air to be used for conditioning the interior space 3. For example, the air intake 8 may be provided with one or more humidity sensors HS. One or more of such sensors may also be located at a different location, for example, at a suitable location in the environment of the apparatus. Such humidity sensors HS may be used for measuring the humidity of the air before, during and/or after the air is received by the air intake.

In accordance with the invention, the refractive index matching system may be arranged to control the refractive index of the conditioning gas mixture as a function of the humidity of the air to be used for conditioning the interior space 3. For example, the refractive index matching gas supply 12 may be arranged to supply a certain amount of nitrogen to the wet air, the amount being dependent of the measured humidity of the air. The refractive index matching system 10 may include one or more computing devices, software and/or the like for determining the suitable amount of matching gas, based on a predetermined refractive index $n_1$ of the purge gas, as well as the measured air humidity.

Alternatively, the apparatus may include a device for determining the refractive index of the conditioning air and/or of the resulting conditioning gas mixture. Such a device may be, for example, an interferometer device, or the like. After such determination, a certain difference with the refractive index $n_1$ of the purge gas can be compensated by mixing one or more suitable refractive index matching gasses to the conditioning air.

During use of the apparatus, a device manufacturing method may be carried out. The method may include, for example, at least the following: projecting a patterned beam of radiation onto a substrate; the use of the at least one interferometer beam 4 for measuring at least one distance and/or displacement, wherein the interferometer beam 4 propagates through at least one interior space 3 of the lithographic apparatus; the supplying of dry air to at least part of the projection system PS for preventing contamination thereof; and the supplying of a conditioning gas mixture, including wet air, to the interior space 3 for conditioning that space 3.

Then, the refractive index of the conditioning gas mixture may be matched to a predetermined refractive index $n_1$ of the dry air by simply mixing a suitable amount of nitrogen to the wet air for obtaining the conditioning gas mixture. Thus, contamination of certain apparatus parts may be reduced by the dry air, and a desired operation of the interferometer positioning device may be guaranteed and/or such operation may be improved, for example, to satisfy desired overlay requirements.

During use, the wet air is preferably being supplied from the exterior space of the lithographic apparatus, for example, from a clean room, to the interior space 3. In one embodiment, the humidity of the wet air is being measured so that the refractive index of the conditioning gas mixture may simply be controlled as a function of the measured humidity of the air. The nitrogen may be supplied from various suitable nitrogen sources, which will be clear to the skilled person.

In an embodiment, the refractive index of the conditioning air is determined first, and matched to the refractive index $n_1$ of the purge gas using one or more suitable refractive index matching gasses. The refractive index $n_2$ of a resulting conditioning gas mixture may be determined to be matched to the refractive index $n_1$ of the purge gas using one or more suitable refractive index matching gasses.

Also, the apparatus may perform a number of test runs, for example, overlay measurements, using different conditioning gas mixtures, to find out which conditioning gas mixture provides best results. The different gas mixtures may be, for example, a mixture of wet air and different amounts of nitrogen.

During use of the embodiment shown in FIG. 2, the dry purging air is being supplied to the lens 9 extending in sight of the substrate table and/or the substrate W. Alternatively, such a purge gas may be supplied, for example, to a part of the projection system extending in sight of the patterning device MA.

Also, the conditioning gas mixture may be supplied to various locations in the apparatus.

EXAMPLE

As an example, a purge gas of dry air is used for purging the microenvironment 6 of the lens 9. Wet air, with a humidity of 40%, is taken in via intake 8. A certain amount of nitrogen is added to the wet air, such that the resulting conditioning gas mixture has the same refractive index as the dry air purge gas.

For example, dry air has a refractive index $n_1$ of 1.000269952, at 22° C. and for light having a wavelength of 633 nm. Wet air, having a humidity rH of 40%, has a lower refractive index $n_{(wet\ air)}$, of 1.000269570 (see also B. Edlén, "The refractive index of air," Metrologia 2, 71–80, 1966). Nitrogen has a refractive index $n_{N2}$ of 1.0002754.

In that case, a mixture of 6.6% nitrogen and 93.4% of the wet air also has a refractive index $n_2$ of 1.000269952, which is the same as the refractive index $n_1$ of the dry air.

Herein, the following formula has been used:

$$n_2 = X_{(wet\ air)} \cdot n_{(wet\ air)} + X_{N2} \cdot n_{N2} = n_1 \quad (1)$$

in which $X_{(wet\ air)}$ is the fraction of wet air in the gas mixture, and $X_{N2}$ is the fraction of nitrogen in that mixture.

The amount of 6.6% nitrogen is relatively low. Typically, the flow of the conditioning air is much higher than the flow of the dry purging air. Therefore, the small amount of nitrogen may be mixed thoroughly to the large flow of wet conditioning air, and with relatively high precision, so that the refractive indexes of the air flows may be matched accurately. Thus, overlay problems may be reduced in a simple manner.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example, imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" as used herein encompass all types of electromagnetic radiation, including ultra-violet (UV) radiation (e.g. having a wavelength of or about 365, 355, 248, 193, 157 or 126 nm) and extreme ultra-violet (EUV) radiation (e.g. having a wavelength in the range of 5–20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein, or a computer system, at least arranged to carry out, or to control a lithographic apparatus to carry out, a method according to the present invention.

The descriptions above are intended to be illustrative, not limiting. Thus, it will be apparent to one skilled in the art that modifications may be made to the invention as described without departing from the scope of the claims set out below.

For example, the first gas supply system may be arranged for supplying a purge gas at least to a part of the projection system extending in sight of the substrate or substrate table. Also, the first gas supply system may be arranged for supplying a purge gas at least to a part of the projection system extending in sight of the patterning device MA.

What is claimed is:

1. A lithographic apparatus comprising:
   a support constructed to support a patterning device, the patterning device being capable of imparting a radiation beam with a pattern in its cross-section to form a patterned radiation beam;
   a substrate table constructed to hold a substrate;
   a projection system configured to project the patterned radiation beam onto a target portion of the substrate;
   an interior space through which an interferometer beam propagates;
   a first gas supply for supplying a purge gas to inhibit contamination of the projection system, wherein said purge gas has a predetermined refractive index;
   a second gas supply for supplying conditioning gas to said space; and
   a refractive index matching system arranged to match the refractive index of said conditioning gas to the predetermined refractive index of said purge gas.

2. An apparatus according to claim 1, wherein a plurality of purge gases are supplied by a plurality of first gas supplies.

3. An apparatus according to claim 1, wherein a plurality of conditioning gases are supplied by a plurality of second gas supplies.

4. An apparatus according to claim 1, wherein said conditioning gas is clean air, and wherein the refractive index matching system is arranged to mix said clean air with a refractive index matching gas for matching the refractive index of the conditioning gas to the refractive index of said purge gas.

5. An apparatus according to claim 4, wherein the refractive index matching system is arranged to mix said clean air with a plurality of refractive index matching gases for matching the refractive index of the conditioning gas to the refractive index of said purge gas.

6. An apparatus according to claim 4, wherein the refractive index matching system comprises a clean air supply, and a refractive index matching gas supply.

7. An apparatus according to claim 6, wherein said clean air supply comprises an air intake for receiving air from an outer environment of the apparatus.

8. An apparatus according to claim 4, wherein said refractive index matching system is arranged to supply said refractive index matching gas in such amount to said clean air that the refractive index of the resulting conditioning gas mixture is substantially the same as the refractive index of said purge gas.

9. An apparatus according to claim 4, wherein said refractive index matching system is arranged to add said refractive index matching gas to said clean air for increasing the refractive index thereof.

10. An apparatus according to claim 4, wherein said refractive index matching system is arranged to measure the humidity of said air.

11. An apparatus according to claim 4, wherein said refractive index matching system is arranged to control the refractive index of said conditioning air as a function of the humidity of said air.

12. An apparatus according to claim 4, wherein said air has a relative humidity of about 10% or more.

13. An apparatus according to claim 12, wherein said air has a relative humidity in the range of about 20–80%.

14. An apparatus according to claim 4, wherein said refractive index matching gas is nitrogen.

15. An apparatus according to claim 1, wherein said refractive index of said purge gas is higher than the refractive index of clean wet air.

16. An apparatus according to claim 1, wherein said purge gas is dry air having a relative humidity of about 0%.

17. An apparatus according to claim 1, further comprising an interferometer arranged for using said interferometer beam to measure distance variations between parts of the apparatus.

18. An apparatus according to claim 1, wherein said first gas supply system is arranged for supplying the purge gas to at least a part of the projection system extending at least partially opposite said patterning device.

19. An apparatus according to claim 1, wherein said first gas supply system is arranged for supplying a purge gas to at least a part of the projection system extending at least partially opposite said substrate table and/or said substrate.

20. An apparatus according to claim 1, wherein said second gas supply system comprises an air shower for feeding said conditioning gas into said space.

21. A device manufactured using the apparatus of claim 1.

22. A lithographic projection apparatus arranged to project a pattern from a patterning device onto a substrate, wherein the apparatus comprises:
    an interferometer that uses an interferometer beam, said beam propagating through an interior space during use, wherein said interior space is filled at least with conditioned air for conditioning said interior space;
    a projection system for projecting the pattern from the patterning device onto the substrate
    a microenvironment at least partially defined by the projection system, the microenvironment being filled with a purge gas; and
    a refractive index matching system arranged to mix said conditioned air with a refractive index matching gas for matching the refractive index of the conditioned air to the refractive index of said purge gas.

23. An apparatus according to claim 22, wherein said refractive index matching system is arranged to mix said conditioned air with a plurality of refractive index matching gases.

24. An apparatus according to claim 22, wherein said purge gas is dry air.

25. An apparatus according to claim 22, wherein said clean air has a humidity of about 10% or more.

26. A lithographic projection apparatus arranged to project a pattern from a patterning device onto a substrate, the apparatus comprising:
    a projection system for projecting the pattern from the patterning device onto the substrate;
    a purge gas supply a purge gas to the projection system;
    an air intake for receiving air from an outer environment of the apparatus;
    an air supply for supplying said air to an interior space of the apparatus; and
    a refractive index matching gas supply for supplying a refractive index matching gas to said air received from the outer environment of the apparatus so that a mixture of the refractive index matching gas and said received from the outer environment of the apparatus matches the refractive index of the purge gas.

27. An apparatus according to claim 26, wherein a plurality of air supplies supply said air to said interior space.

28. An apparatus according to claim 26, wherein a plurality of refractive index matching gases are supplied by a plurality of refractive index matching gas supplies.

29. An apparatus according to claim 26, further comprising a sensor for measuring the humidity of said air before, during, and/or after said air is received by said air intake.

30. An apparatus according to claim 29, wherein said refractive index matching gas supply is arranged to supply a predetermined amount of said refractive index matching gas to said air received from said outer environment, said amount being dependent of the measured humidity of said air.

31. An apparatus according to claim 26, wherein said refractive index matching gas has a refractive index which is higher than the refractive index of clean dry air.

32. An apparatus according to claim 26, wherein said refractive index matching gas is nitrogen.

33. An apparatus according to claim 26, wherein said air has a relative humidity of about 10% or more.

34. An apparatus according to claim 33, wherein said air has a relative humidity in the range of about 20–80%.

35. An apparatus according to claim 26, further comprising an interferometer which is arranged for using an interferometer beam to measure distance variations between parts of the apparatus, said interferometer beam traversing said interior space during use.

36. A lithographic apparatus comprising:
    a substrate table constructed to hold a substrate;
    a projection system configured to project a patterned radiation beam onto a target portion of the substrate;
    a first gas supply for supplying a dry purge gas to a microenvironment, said microenvironment extending between said projection system and said substrate and/or said substrate table;
    an interior space through which a position sensor beam propagates during use;
    a second gas supply for supplying air to said interior space; and
    a refractive index matching system arranged to the match the refractive index of said air to the refractive index of said purge gas by utilizing a refractive index matching gas.

37. An apparatus according to claim 36, wherein a plurality of dry gases are supplied by a plurality of first gas supplies.

38. An apparatus according to claim 36, wherein said air is supplied by a plurality of second gas supplies.

39. An apparatus according to claim 36, wherein a plurality of refractive index matching gases are utilized by said refractive index matching system.

40. A lithographic apparatus comprising:
a support constructed to support a patterning device, the patterning device being capable of imparting a radiation beam with a pattern in its cross-section to form a patterned radiation beam;
a substrate table constructed to hold a substrate;
a projection system configured to project the patterned radiation beam onto a target portion of the substrate;
a first gas supply for supplying a dry purge gas to a microenvironment, said microenvironment extending between said projection system and said patterning device;
an interior space through which a position sensor beam propagates during use;
a second gas supply for supplying air to said interior space; and
a refractive index matching system arranged to match the refractive index of said air to the refractive index of said purge gas by utilizing a refractive index matching gas.

41. An apparatus according to claim 40, wherein a plurality of dry gases are supplied by a plurality of first gas supplies.

42. An apparatus according to claim 40, wherein said air is supplied by a plurality of second gas supplies.

43. An apparatus according to claim 40, wherein a plurality of refractive index matching gases are utilized by said refractive index matching system.

44. A device manufacturing method, utilizing a lithographic apparatus, the method comprising:
projecting a patterned beam of radiation onto a substrate with a projection system;
measuring distance and/or displacement of a part of the lithographic apparatus with an interferometer beam, said interferometer beam propagating through at least one interior space of the lithographic apparatus;
supplying a purge gas to the projection system for inhibiting contamination thereof;
supplying a conditioning gas mixture to said interior space for conditioning said interior space; and
matching the refractive index of said conditioning gas mixture to a predetermined refractive index of said purge gas.

45. A method according to claim 44, wherein said conditioning gas mixture contains clean conditioning air, and a refractive index matching gas, such that the refractive index of the resulting conditioning gas mixture is substantially the same as the refractive index of said purge gas.

46. A method according to claim 45, wherein said clean conditioning air is supplied from an exterior space of the lithographic apparatus to said interior space.

47. A method according to claim 45, wherein a refractive index matching gas is added to said clean conditioning air for increasing the refractive index thereof.

48. A method according to claim 45, further comprising measuring the humidity of said clean conditioning air, and controlling the refractive index of said conditioning gas mixture as a function of the measured humidity of said air.

49. A method according to claim 45, wherein said clean conditioning air has a relative humidity of about 10% or more.

50. A method according to claim 49, wherein said clean conditioning air has a relative humidity of about 20–80%.

51. A method according to claim 44, wherein said refractive index of the purge gas is higher than the refractive index of clean wet air.

52. A method according to claim 44, wherein said purge gas is dry air having a relative humidity of about 0%.

53. A method according to claim 44, wherein said purge gas is supplied to a part of the projection system extending in sight of a patterning device capable of imparting a radiation beam with a pattern in its cross-section to form the patterned beam.

54. A method according to claim 44, wherein said purge gas is supplied to a part of the projection system extending in sight of said substrate and/or a substrate table constructed to hold said substrate.

55. A method according to claim 44, wherein said conditioning gas mixture comprises clean air and a refractive index matching gas comprising nitrogen.

56. A method according to claim 44, wherein the refractive index of the conditioning gas mixture is determined and matched to the refractive index of the purge gas using a suitable refractive index matching gas.

57. A method according to claim 44, wherein the refractive index of the conditioning gas mixture is determined and matched to the refractive index of the purge gas using a plurality of suitable refractive index matching gases.

58. A method according to claim 44, further comprising performing a plurality of test runs using different conditioning gas mixtures, wherein the different conditioning gas mixtures are mixtures of wet air with different amounts of nitrogen.

59. A device manufactured according to the method of claim 44.

60. A device manufacturing method, utilizing a lithographic apparatus, the method comprising:
patterning a beam of radiation with a patterning device;
projecting the patterned beam of radiation onto a substrate with a projection system;
measuring distance and/or displacement of a part of the lithographic apparatus with an interferometer beam, said interferometer beam propagating through an interior space of the lithographic apparatus;
conditioning the interior space with conditioning air;
filling a microenvironment within the lithographic apparatus with a purge gas; and
mixing said conditioning air with a refractive index matching gas for matching the refractive index of the air to the refractive index of said purge gas.

61. A method according to claim 60, wherein a plurality of refractive index matching gases are mixed with said conditioning air for matching the refractive index of the air to the refractive index of said purge gas.

62. A method according to claim 61, further comprising determining the refractive index of said conditioning air, and matching the refractive index of said conditioning air to the refractive index of the purge gas using said plurality of refractive index matching gases.

63. A method according to claim 60, wherein said purge gas is dry air.

64. A method according to claim 60, wherein said conditioning air has a humidity of about 10% or more.

65. A method according to claim 60, further comprising determining the refractive index of said conditioning air, and matching the refractive index of said conditioning air to the refractive index of the purge gas using said refractive index matching gas.

66. A device manufacturing method, utilizing a lithographic apparatus, the method comprising:

patterning a beam of radiation with a patterning device;

projecting the patterned beam of radiation onto a substrate with a projection system;

supplying a purge gas to the projection system;

pumping air into an interior space of the apparatus from an outer environment of the apparatus; and supplying a refractive index matching gas to the air received from the outer environment of the apparatus so that the reflective index of a mixture of the refractive index matching gas and the air received from the outer environment of the apparatus matches the refractive index of the purge gas.

67. A method according to claim 66, wherein the humidity of said air is measured before, during and/or after the air is received by said air intake.

68. A method according to claim 66, wherein said refractive index matching gas is being supplied in a certain amount to said air, wherein said amount is dependent of the measured humidity of said air.

69. A method according to claim 66, wherein said refractive index matching gas has a refractive index which is higher than the refractive index of clean dry air.

70. A method according to claim 66, wherein said refractive index matching gas is nitrogen.

71. A method according to claim 66, wherein said air has a relative humidity of about 10% or more.

72. A method according to claim 71, wherein said air has a relative humidity in the range of about 20–80%.

73. A method according to claim 66, further comprising measuring distance variations between parts of the apparatus with an interferometer which is arranged for generating an interferometer beam such that said interferometer beam traverses said interior space.

74. A computer readable storage medium storing a program which when run on a computer controls the computer to perform a method comprising:

projecting a patterned beam of radiation onto a substrate with a projection system of a lithographic apparatus;

measuring distance and/or displacement of a part of the lithographic apparatus with an interferometer beam, said interferometer beam propagating through an interior space of the lithographic apparatus;

supplying a purge gas to the projection system for inhibiting contamination thereof;

supplying a conditioning gas mixture to said interior space for conditioning said interior space; and matching the refractive index of said conditioning gas mixture to a predetermined refractive index of said purge gas.

* * * * *